United States Patent [19]
Abe et al.

[11] Patent Number: 5,833,591
[45] Date of Patent: Nov. 10, 1998

[54] ELECTRONIC COMPONENT MOUNTING APPARATUS AND NOZZLE REPLACEMENT

[75] Inventors: Nobutaka Abe, Dazaifu; Akira Nishimura, Fukuoka, both of Japan

[73] Assignee: Matsushita Electric Industrial Co. Ltd., Osaka, Japan

[21] Appl. No.: 824,055

[22] Filed: Mar. 21, 1997

[30] Foreign Application Priority Data

Mar. 28, 1996 [JP] Japan .................................. 8-073530

[51] Int. Cl.⁶ .................................................. B23Q 3/155
[52] U.S. Cl. .................................. 483/12; 29/740; 483/58
[58] Field of Search ............................ 483/12, 32, 60, 483/58, 30, 56, 54, 10, 63, 38, 51; 29/740

[56] References Cited

U.S. PATENT DOCUMENTS 5,018,266  5/1991  Hutchinson et al. ...................... 483/32

FOREIGN PATENT DOCUMENTS 2132897  5/1990  Japan .
4188742  7/1992  Japan .

*Primary Examiner*—William R. Griggs
*Attorney, Agent, or Firm*—Stevens, Davis, Miller & Mosher, L.L.P.

[57] ABSTRACT

An electronic component mounting apparatus for determining whether or not a nozzle replacement operation is successfully performed. A horizontal array of nozzles are accommodated in the holder in a nozzle stocker, and a light emitting device and a light receiving device are arranged so that the light path between both runs above the nozzles. The nozzle stocker is arranged in a travel path of a feeding head. The nozzle mount of the feeding head returns a used nozzle into the holder or mounts a new nozzle thereon. When any nozzle remains lifted from the holder intercepting the light path, a returning operation of the used nozzle is determined to be a failure. When a nozzle replacement is performed, its success or failure is reliably determined by detecting a intercepting height of light and release height of light by the nozzle and nozzle mount, respectively.

6 Claims, 5 Drawing Sheets

ELECTRONIC COMPONENT MOUNTING APPARATUS AND NOZZLE REPLACEMENT

BACKGROUND OF THE INVENTION

1. Field of the Invention

The present invention relates to an electronic component mounting apparatus for picking and placing electronic components to a circuit board and a method of replacing a nozzle in the electronic component mounting apparatus.

2. Description of the Related Art

Electronic component mounting apparatuses pick up electronic components stored in a component feeder with their head nozzle vacuum-sucking electronic components and bring and mount them on a circuit board that is positioned to a predetermined place. The component feeder holds electronic components of a variety of types in a wide range of size, and its feeding head automatically changes its nozzle in accordance with the type of the electronic component to be picked up. The electronic component mounting apparatus is therefore provided with a nozzle stocker which stocks a diversity of nozzles. The feeding head moves above the nozzle stocker and is then vertically lowered and raised to replace automatically its nozzle.

To replace the head, the feeding head is shifted over the nozzle stocker, and is lowered and then raised while the nozzle used is removed from a nozzle mount to be returned back into the nozzle stocker, and a new nozzle is taken by mounting it on the nozzle mount. There are times when the head fails to return its used nozzle in a correct alignment into the nozzle stocker with the nozzle left elevated from the nozzle stocker.

Japanese Unexamined Patent Publication 2-132897 and Japanese Unexamined Patent Publication 4-188742 disclose units that detect such an error in the returning action of nozzle. In these disclosures, a holder that houses nozzles is equipped with a number of light emitting devices and light receiving devices facing nozzles. Light emitted by the light emitting devices is received by the light receiving devices and an error, if any, in the nozzle returning action is then detected.

In the prior art, however, light emitting devices and light receiving devices are required for the respective nozzles, increasing the count of the devices, making the wiring of the devices complicated and thereby pushing up the cost of the unit.

SUMMARY OF THE INVENTION

Accordingly, it is an object of the present invention to provide an electronic component mounting apparatus of a simple mechanism that allows nozzles to be reliably replaced and to provide a nozzle replacement method in the electronic component mounting apparatus.

In the electronic component mounting apparatus of the present invention, a nozzle stocker comprises a holder for holding nozzles in a single array and detector means comprising a light emitting device and a light receiving device, of which light path runs above the array of nozzles.

The electronic component mounting apparatus of the present invention comprises a circuit board positioner, a feeding head with a nozzle for vacuum-sucking an electronic component from a component feeder, and for moving and mounting the electronic component onto a circuit board that is positioned by the circuit board positioner, and a nozzle stocker arranged in a travel path of the feeding head, for stocking nozzles that are detachably mounted on a nozzle mount of the feeding head, wherein the nozzle stocker comprises a holder for holding the nozzles in a single array and detector means comprising a light emitting device and a light receiving device, of which light path runs above the array of the nozzles.

The nozzle replacement method employed in the electronic component mounting apparatus comprises the steps of moving a nozzle held by a nozzle mount of a feeding head, over a hole of a nozzle stocker, lowering the nozzle to be inserted down into a nozzle stocker while detecting, with detector means, the intercepting height of light at which the lower end of the nozzle starts intercepting a light path above the nozzle stocker, detaching the nozzle mount from the nozzle and then raising the nozzle mount while detecting, with the detector means, the release height of light at which the nozzle mount stops intercepting the light path, and computing the height difference between the two heights with a controller to determine from the height difference whether the nozzle is correctly returned into the nozzle stocker.

According to the present invention, a single light emitting device and a single light receiving device determine the positions of all nozzles put back into the nozzle stocker. By detecting the intercepting height of light and release height of light, a determination is reliably made of whether each nozzle is successfully returned and whether each nozzle is successfully mounted on the nozzle mount. In this way, the light emitting device and light receiving device in the holder are used not only to determine the position of the nozzle returned but also to determine whether the nozzle replacement is successful or not. The construction of the arrangement is quite simple.

DESCRIPTION OF THE PREFERRED EMBODIMENTS

According to a first aspect of the present invention, a single light emitting device and a single light receiving device determine the positions of all nozzles put back into a nozzle stocker.

According to a second aspect of the present invention, by detecting the intercepting height of light and release height of light, a determination is reliably made of whether each nozzle is successfully returned and whether each nozzle is successfully mounted on a nozzle mount.

Figure 1:
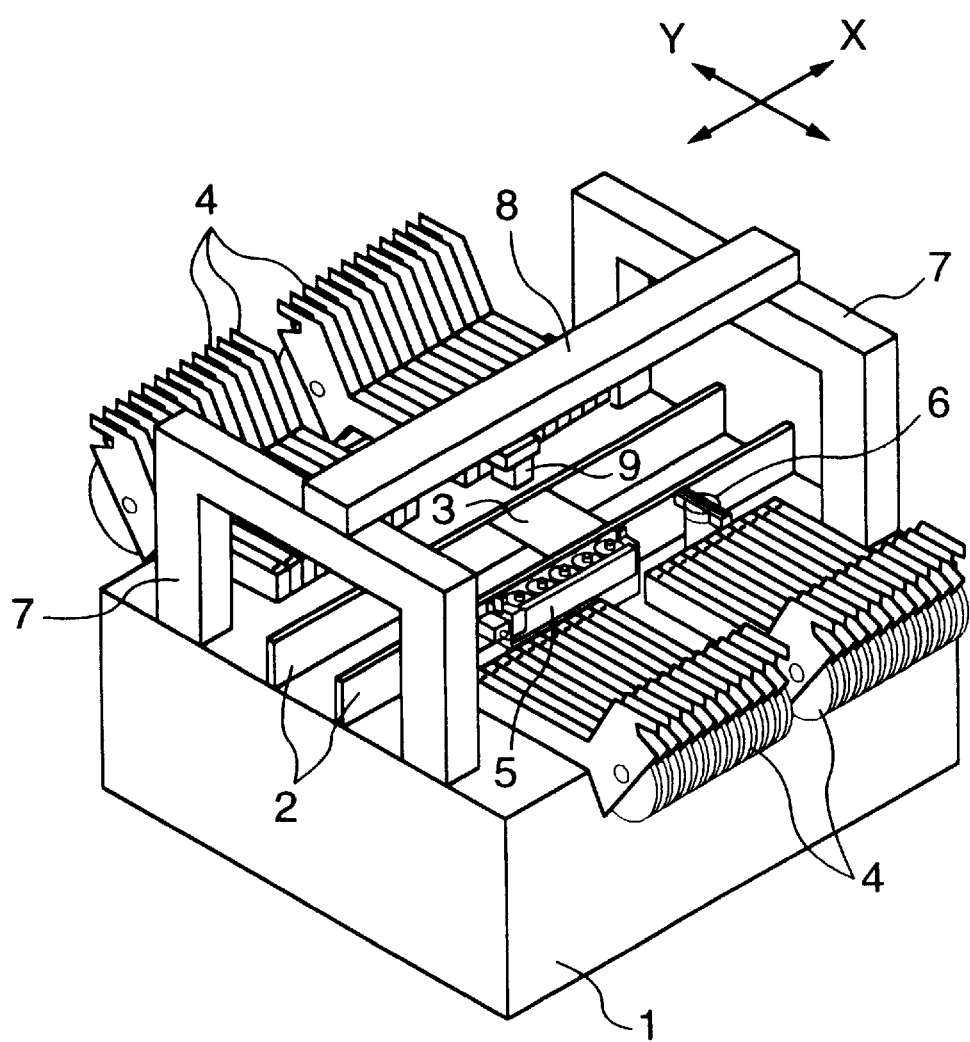
FIG. 1 is a perspective view showing the electronic component mounting apparatus according to one embodiment of the present invention.
Figure 2:
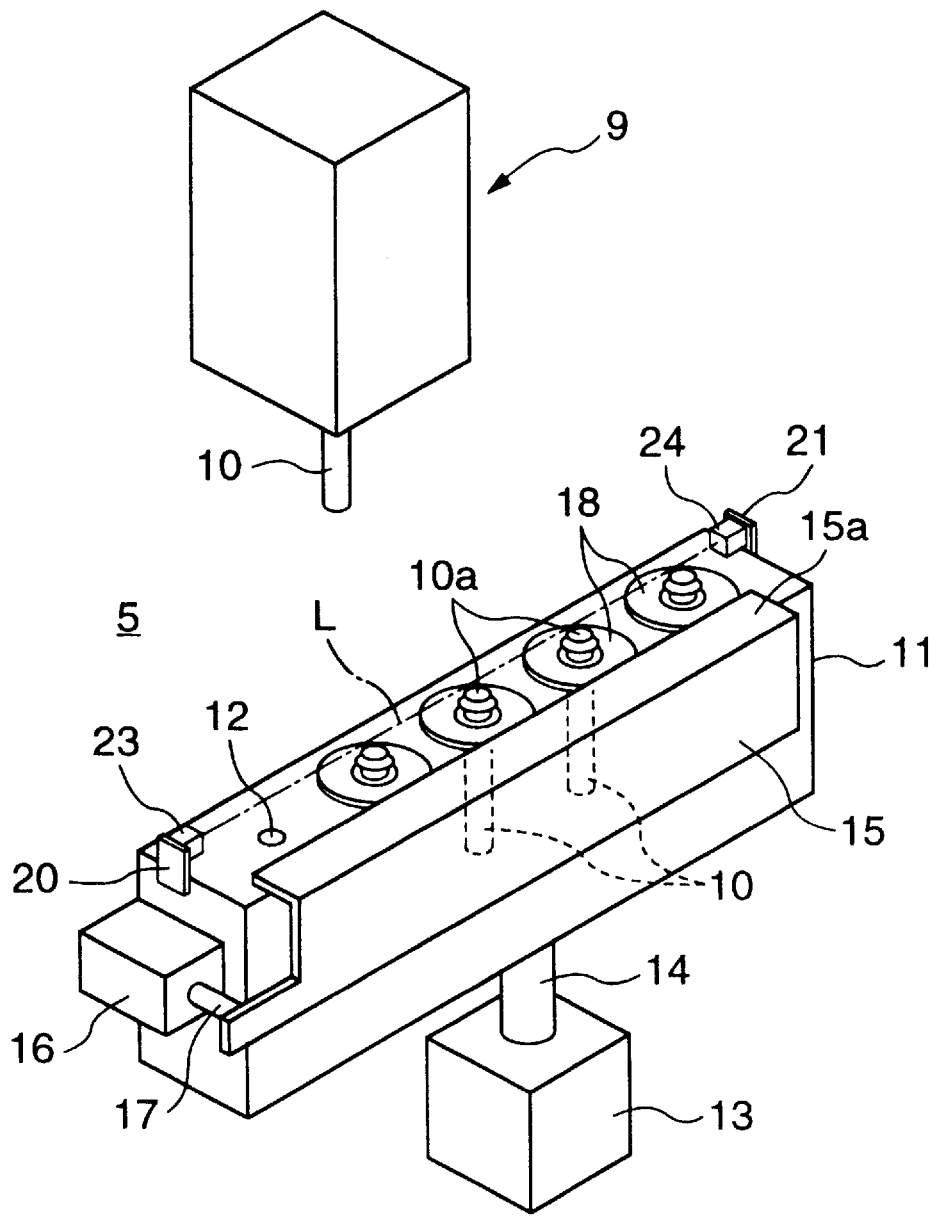
FIG. 2 is a perspective view showing the nozzle stocker in the electronic component mounting apparatus of the present invention.
Figure 3:
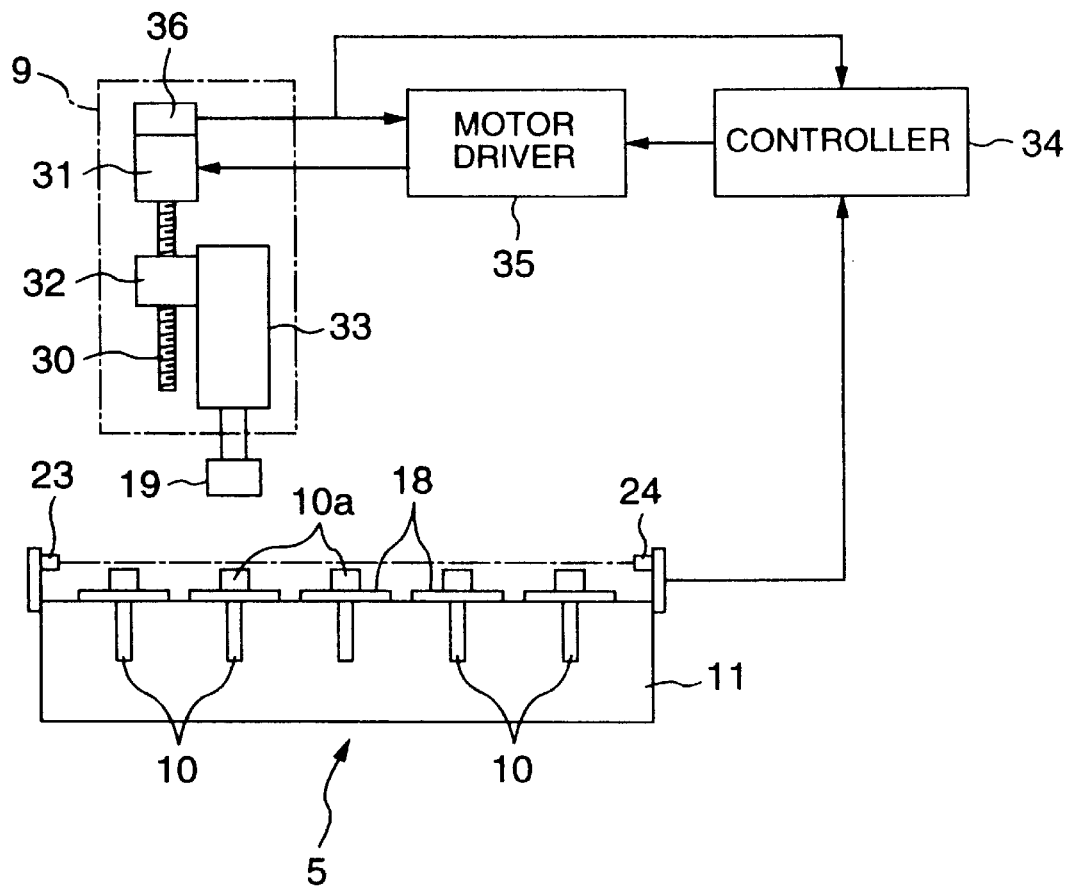
FIG. 3 is a block diagram showing the feeding head and the nozzle stocker in the electronic component mounting apparatus of the present invention.
Figures 4A, 4B, 4C, 4D:
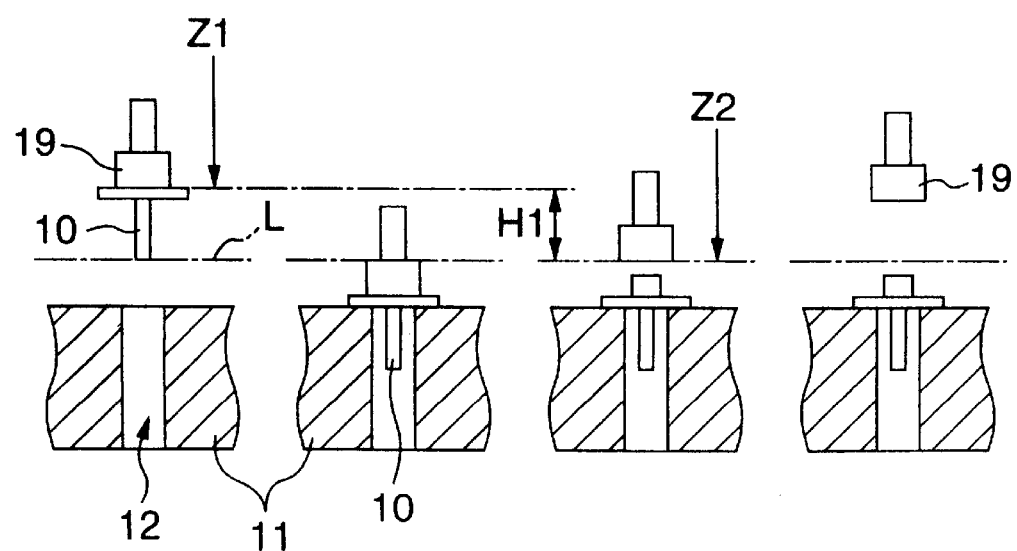
FIGS. 4A through 4D show process drawings for a nozzle returning operation in the electronic component mounting apparatus of the present invention.
Figure 5:
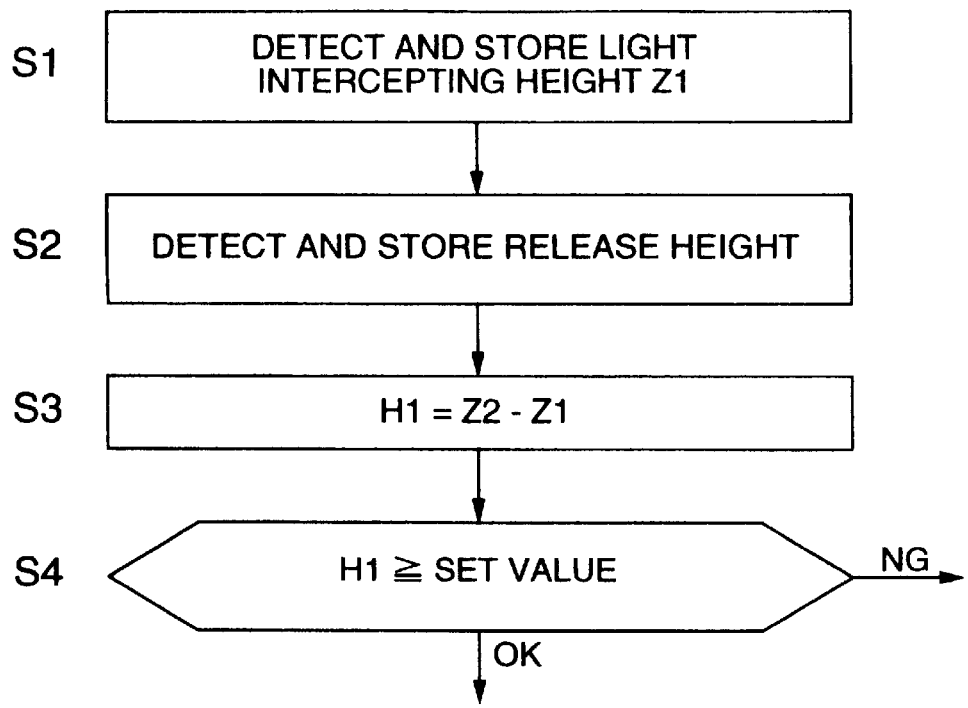
FIG. 5 is a flow diagram showing the nozzle returning operation in the electronic component mounting apparatus of the present invention.
Figure 6:
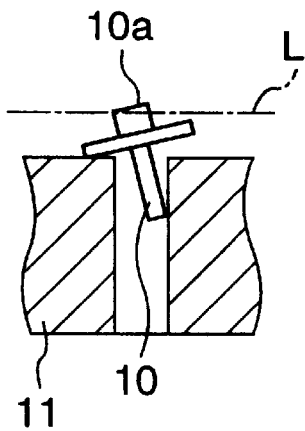
FIG. 6 is a fragmentary cross-sectional view showing the nozzle stocker in the electronic component mounting apparatus of the present invention.

Referring to the drawings, one embodiment of the present invention is now discussed. FIG. 1 is a perspective view of an electronic component mounting apparatus of the embodiment of the present invention. FIG. 2 is a perspective view showing the nozzle stocker in the electronic component mounting apparatus. FIG. 3 is a block diagram showing the feeding head and the nozzle stocker in the electronic component mounting apparatus. FIGS. 4A through 4D are process drawings showing a nozzle returning operation in the electronic component mounting apparatus. FIG. 5 is a flow diagram showing the nozzle returning operation in the electronic component mounting apparatus. FIG. 6 is a fragmentary cross-sectional view showing the nozzle stocker in the electronic component mounting apparatus. FIGS. 7A through 7D are process drawings for a nozzle mounting operation in the electronic component mounting apparatus. FIG. 8 is a flow diagram showing the nozzle mounting operation in the electronic component mounting apparatus.

As shown in FIG. 1, guide rails 2 are arranged on the top of a base 1, with a circuit board 3 positioned on the guide rails 2. The guide rails 2 serve as a positioner for the circuit board 3. Arranged on both sides of the guide rails 2 are a number of component feeders 4. The component feeders 4 hold electronic components of a diversity of types. Arranged between the guide rails 2 and the component feeders 4 are a nozzle stocker 5 and a recognition unit 6.

A pair of left and right Y tables 7 are mounted on the base 1 and an X table 8 is supported at the Y tables 7. Each of the Y tables 7 and X table 8 houses a feed mechanism such as a feed screw. The X table 8 has a feeding head 9. With the X table 8 and Y tables 7 driven, the feeding head 9 moves two-dimensionally in an X direction and Y direction to bring electronic components from the component feeders 4 to the circuit board 3 and to mount them there. Thus, the Y tables 7 and X table 8 are moving means for moving two-dimensionally the feeding head 9 in any arbitrary direction.

Referring to FIG. 2, the nozzle stocker 5 is constructed of a generally rectangular parallelepiped holder 11. The holder 11 has an array of holes 12, in which nozzles 10 are respectively housed. The holder 11 is supported by the rod 14 of a cylinder 13. When the rod 14 is projected, the holder 11 is raised. When the rod 14 is retracted, the holder 11 is lowered. The cylinder 13 thus serves as raise/lower means for the nozzle stocker 5.

The holder 11 has, on its one shoulder portion, a locking member 15 having an L shape in its cross section. Attached on one end face of the holder 11 is a cylinder 16, whose rod 17 is connected to the locking member 15. With the rod 17 projected and retracted, the locking member 15 moves horizontally back and forth, respectively. Each of the nozzles 10 has a flange portion 18. The rod 17 of the cylinder 16 is normally retracted and the top flange portion 15a of the locking member 15 is positioned above the holder 11, and thus is positioned over the peripheries of the flange portions 18a. With the rod 17 projected, the top flange portion 15a is withdrawn sidewardly from the holder 11, and thus disengages the flange portions 18.

Brackets 20, 21 are respectively extended upwardly from both end faces of the holder 11. A light emitting device 23 is mounted on the inward looking face of the bracket 20 while a light receiving device 24 is mounted on the inward looking face of the bracket 21. The light emitted from the light emitting device 23 is introduced in the light receiving device 24, and the light path L therebetween runs above the nozzles 10 accommodated in alignment in a array along the holder 11. When there is any faulty nozzle stock state, for example, a nozzle 10 staying lifted from the holder 11, the light path L is intercepted by this nozzle 10, and light is unable to reach the light receiving device 24. In this way a faulty stock state of each nozzle 10 is detected. The light emitting device 23 and light receiving device 24 serve as the detector means for the nozzles 10.

Referring to FIG. 3, the feeding head 9 houses a vertical feed screw 30, a motor 31 for driving the feed screw 30, a nut 32 meshed with the feed screw 30, and a block 33 connected to the nut 32. Attached to the lower portion of the block 33 is a nozzle mount 19 with which the top end mating portion 10a of the nozzle 10 is detachably engaged. With the motor 31 rotating in a normal direction or in a reverse direction, the feed screw 30 rotates normally or in reverse, respectively. The nut 32 moves vertically upwardly or downwardly along the feed screw 30, and the nozzle 10 mounted to the nozzle mount 19 thus moves vertically upwardly or downwardly as well. The components designated 30 through 33 thus constitute the vertical moving means for the nozzle 10.

The motor 31 is driven by a motor driver 35 that is controlled by a controller 34. The light receiving device 24 feeds its output to the controller 34. The controller 34 comprises a computing block and a memory block. The rotation of the motor 31 is detected by an encoder 36, and the detected signal is fed back to the motor driver 35.

The operation of the electronic component mounting apparatus thus constructed is now discussed. As shown in FIG. 1, with the X table 8 and Y tables 7 driven, the feeding head 9 moves above the component feeder 4, is lowered and raised to pick up an electronic component out of the component feeder 4 with the nozzle 10 vacuum-sucking the electronic component at its bottom end.

The feeding head 9 then moves above the recognition unit 6, which identifies the position of the electronic component that is vacuum-sucked at the bottom end of the nozzle 10. The feeding head 9 moves over to predetermined coordinates of the circuit board 3, where the nozzle 10 performs a raise/lower operation to place the electronic component onto the circuit board 3.

The nozzle 10 of the feeding head 9 is replaced depending on the type of electronic component. Referring to FIGS. 4A through 8, the replacement method of the nozzle 10 is discussed. As shown in FIGS. 4A through 6, the method of returning the used nozzle 10 into the hole 12 of the holder 11 is discussed first. As shown in FIG. 4A, the nozzle 10 held by the feeding head 9 is moved over the vacant hole 12 in the holder 11. By rotating the motor 31 in the normal direction, the nozzle 10 is lowered. The bottom end of the nozzle 10 starts intercepting the light path L, and the intercepting height of light Z1 is detected and stored in the controller 34 (step S1 in FIG. 5). The rod 17 of the cylinder 16 shown in FIG. 2 is then projected, and the locking member 15 is withdrawn sidewardly so that it may not interfere with the nozzle 10 in its insertion motion into the hole 12. FIG. 4B shows the fully inserted state of the nozzle 10 in the hole 12.

By retracting the rod 17 of the cylinder 16 as shown in FIG. 2, the top flange portion 15a of the locking member 15 is positioned above the flange portion 18 of the nozzle 10. When the motor 31 is rotated in the reverse direction to raise the block 33, the nozzle 10 is forcibly detached from the nozzle mount 19 because the flange portion 18 of the nozzle 10 is restrained by the top flange portion 15a, and thus the nozzle 10 remains seated in the holder 11.

When the motor 31 is further rotated in the reverse direction to raise the nozzle mount 19, the nozzle mount 19 is clear of the light path L releasing itself from the light intercepting state (see FIG. 4C). The release height of light Z2 is detected and stored in the memory block in the controller 34 (step S2 in FIG. 5). The controller 34 computes the difference H1=Z2−Z1 between two heights (step S3) and compares the computed result H1 with a stored set value. When the difference H1 is equal to the set value or within a permissible range of the set value, the comparison result is OK (the returning operation of the nozzle 10 is a success), and the feeding head proceeds to the mounting operation of a nozzle as shown in FIGS. 7 and 8.

When the nozzle 10 is not properly returned and remains lifted from the holder 11 as shown in FIG. 6, the light intercepting state is not released with Z2 being continuously zero. The value H1 is greatly different from the set value, and the comparison result is NG (the returning operation of the nozzle 10 is a failure). In this case, a buzzer may go off to alert an operator that the returning operation is a failure. In this way, the apparatus is used to determine the position of each nozzle 10 returned in the holder 11.

Referring to FIGS. 7A through 7D and 8, the mounting operation of a nozzle is now discussed. Through the operation shown in FIGS. 4A through 6, the feeding head 9 returns the used nozzle 10 into the holder 11, and then moves just above a desired nozzle 10 (see FIG. 7A). With the motor 31 driven, the nozzle mount 19 is lowered, intercepting the light path L (see FIG. 7B). The intercepting height of light Z11 is stored in the memory block (step S11 in FIG. 8).

Figures 7A, 7B, 7C, 7D:
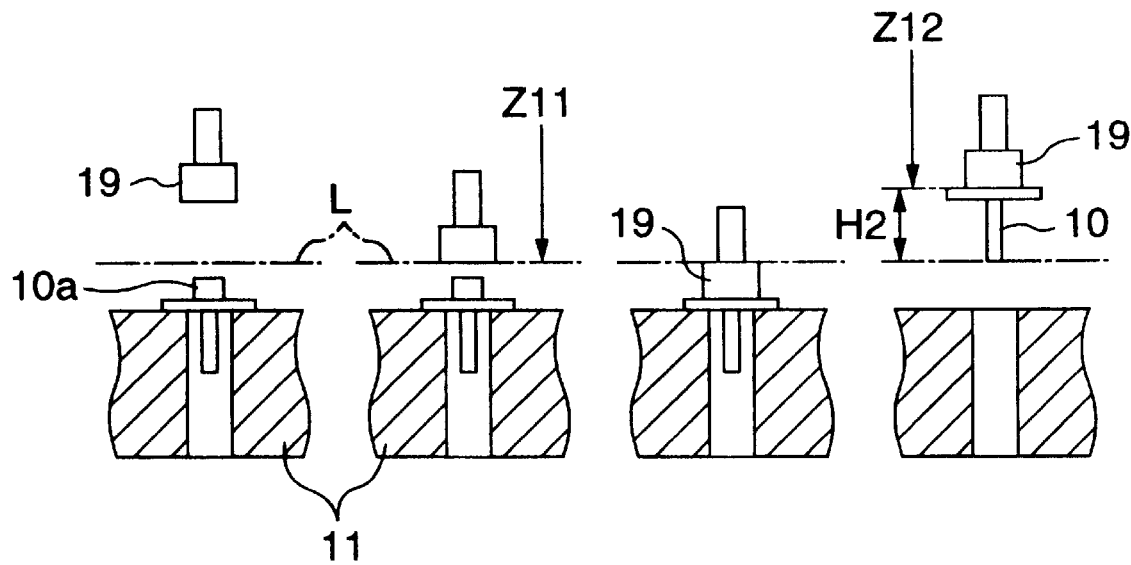
FIGS. 7A through 7D are process drawings for a nozzle mounting operation in the electronic component mounting apparatus of the present invention.
Figure 8:
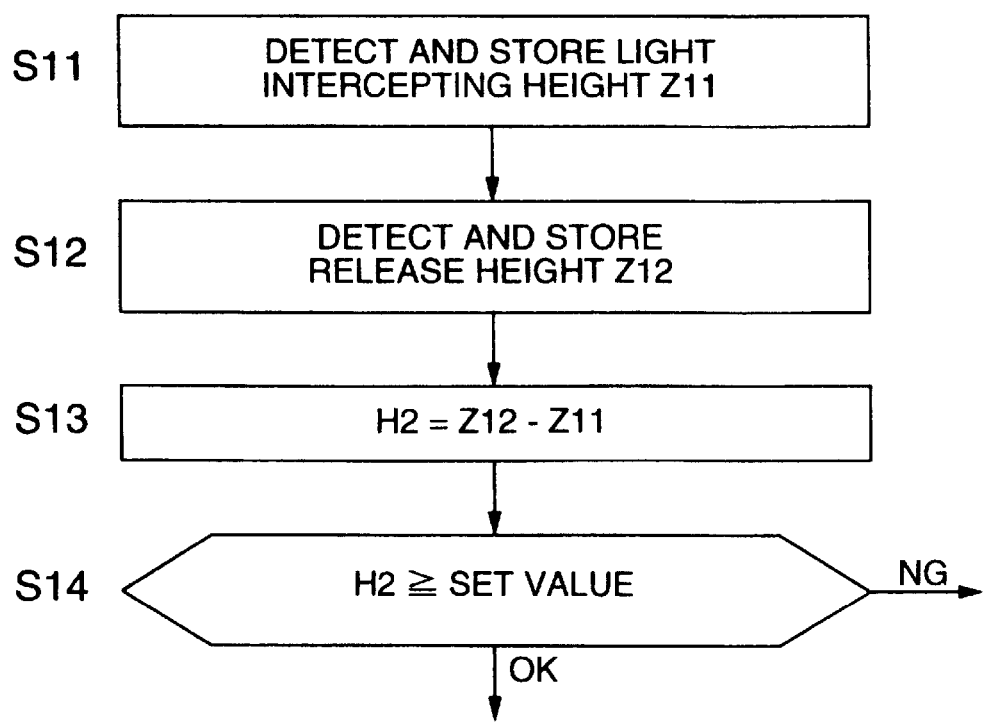
FIG. 8 is a flow diagram showing the nozzle mounting operation in the electronic component mounting apparatus of the present invention.

The nozzle mount 19 is further lowered to mate with the top end mating portion 10a of the nozzle 10 (FIG. 7C). The nozzle mount 19 is then raised, the release height of light Z12 where the nozzle 10 is clear of the light path is detected (step S12 in FIG. 8), and the difference H2=Z12−Z11 is computed (step S13 in FIG. 8). The difference H2 is compared with the set value stored in the memory (step S14 in FIG. 8) to determine whether the result is NG or OK. When the attempt to pick up the nozzle 10 fails and the nozzle 10 still remains in the holder 11, Z12 is equal to Z11, and NG is its result. The desired nozzle 10 is attached to the nozzle mount 19 in this way, and the mounting operation of electronic components now starts.

What is claimed is:

1. An electronic component mounting apparatus comprising:

a circuit board positioner for positioning a circuit board;

a feeding heads with a nozzle mount and a nozzle detachably mounted on the nozzle mount, for vacuum-sucking an electronic component from a component feeder, and for moving along a travel path and mounting the electronic component onto the circuit board that is positioned by the circuit board positioner; and a nozzle stocker, arranged in the travel path of the feeding head, for stocking a plurality of additional nozzles for being detachably mounted on the nozzle mount of the feeding head;

wherein the nozzle stocker comprises:

a holder for holding the additional nozzles in a single array; and detector means comprising a light emitting device for emitting light along a light path and a light receiving device for receiving the light, the light emitting device and the light receiving device being so disposed that the light path runs above the array of the additional nozzles.

2. An electronic component mounting apparatus according to claim 1, wherein the holder has a substantially rectangular parallelepiped shape and has a top surface with an array of holes, formed in the top surface, into which the nozzles are respectively inserted, and comprises a shoulder portion with a locking member having an L shape in cross section for engaging and disengaging the additional nozzles.

3. An electronic component mounting apparatus according to claim 1, further comprising moving means for moving the feeding head in at least a first direction and a second direction perpendicular to the first direction so as to move the feeding head along the travel path.

4. An electronic component mounting apparatus according to claim 1, wherein the circuit board positioner comprises a plurality of guide rails for positioning the circuit board.

5. An electronic component mounting apparatus according to claim 4, wherein the nozzle stocker is disposed between the component feeder and the plurality of guide rails.

6. An electronic component mounting apparatus according to claim 5, wherein the moving means comprises:

X table means for moving the feeding head in the first direction; and

Y table means for moving the feeding head in the second direction.

* * * * *